United States Patent
Tokunaga et al.

[11] Patent Number: 5,873,985
[45] Date of Patent: Feb. 23, 1999

[54] PROCESS OF MAKING SQUID DEVICE HAVING TILT-BOUNDARY JUNCTION

[75] Inventors: Seiichi Tokunaga; Ryokan Yuasa; Shuji Fujiwara; Masao Nakao; Hiroaki Furukawa, all of Tsukuba, Japan

[73] Assignee: Sanyo Electric Co., Ltd., Osaka, Japan

[21] Appl. No.: 36,148

[22] Filed: Mar. 24, 1993

Related U.S. Application Data

[63] Continuation-in-part of Ser. No. 861,193, Mar. 31, 1992, abandoned.

[30] Foreign Application Priority Data

| Apr. 11, 1991 | [JP] | Japan | 3-79097 |
| Nov. 28, 1991 | [JP] | Japan | 3-314958 |
| Mar. 26, 1992 | [JP] | Japan | 4-068369 |

[51] Int. Cl.$^6$ ................................................ C23C 14/34
[52] U.S. Cl. .................... 204/192.34; 204/192.24; 505/162; 505/477; 505/702
[58] Field of Search ................... 505/1, 702, 477, 505/162; 204/192.34, 298.36, 192.15, 192.24

[56] References Cited

U.S. PATENT DOCUMENTS

| 4,936,968 | 6/1990 | Ohnishi et al. | 204/298.36 X |
| 4,980,341 | 12/1990 | Gehring | 505/702 X |
| 5,026,682 | 6/1991 | Clark et al. | 505/702 X |
| 5,035,787 | 7/1991 | Parker et al. | 204/298.36 X |
| 5,143,896 | 9/1992 | Harada et al. | 505/1 |
| 5,149,974 | 9/1992 | Kirch et al. | 204/298.36 X |
| 5,157,466 | 10/1992 | Char et al. | 505/702 X |
| 5,196,395 | 3/1993 | James et al. | 505/702 X |

FOREIGN PATENT DOCUMENTS

| 60-185285 | 9/1985 | Japan . |
| 2130422 | 5/1984 | United Kingdom . |

OTHER PUBLICATIONS

European Search Report, dated Jul. 18, 1995, Appl. No. 94304767.0.

K. J. Kimmler, et al., "New 64K Memory Chip Gets the Picture", AT&T Bell Laboratories Record, No. 1, Jan. 1985.

T. Ishikawa, et al., "One–Bit A/D Converters IC For Audio Delay", IEEE Transactions on Consumer Electronics, vol. 35, No. 4, Nov. 1989, pp. 767–773.

Kamei et al., "Effect . . . Films", Physica C 182 (1991) 123–126.

Tsukamoto et al., "Low–Temperature . . . Deposition", Jap. Journal of Appl. Physics, vol. 30, No. 5A, May 1991 pp. L830–L833.

K.Char, et al., "Bi–epitaxial grain boundary junctions in YBa2Cu3O7", May 13, 1991, Appl.phys. Lett. 59 (6), Aug. 1991.

Tetsuy Takami, et al., "Artificial Grain Boundary Junctions in BiSrCaCuO Thin Films with (11n) and (001) Orientation", Dec. 21, 1991, Jpn.J.Appl.Phys. vol. 31 (1992) pp. L246–L248, Mar. 1992.

*Primary Examiner*—Nam Nguyen
*Attorney, Agent, or Firm*—Loeb & Loeb LLP

[57] ABSTRACT

An oxide film having a desired pattern is first formed on a magnesia substrate. A superconducting oxide film is then formed on the exposed portion of the magnesia substrate and also on the oxide film. Thus, a tilt-boundary junction is formed in the boundary between the superconducting oxide film portion on the magnesia substrate and the superconducting oxide film portion on the oxide film. The tilt-boundary junction functions as a Josephson junction. By utilizing the Josephson junction in the tilt-boundary junction, a SQUID pattern can be formed on the magnesia substrate to provide a SQUID device.

9 Claims, 12 Drawing Sheets

PROCESS OF MAKING SQUID DEVICE HAVING TILT-BOUNDARY JUNCTION

This application is a continuation-in-part of application Ser. No. 07/861,193, filed Mar. 31, 1992, now abandoned in favor of continuing application Ser. No. 08/036,148, filed Mar. 24, 1993.

BACKGROUND OF THE INVENTION

1. Field of the Invention

The present invention relates to a process of making a SQUID (Superconducting Quantum Interference Device) device having a superconducting film with a high superconducting transition temperatures.

2. Description of the Prior Art

A SQUID device using superconducting film utilizes Josephson junction and is currently used as a fluxmeter for measuring an abnormal localized field and its derivative amount with increased sensitivity and accuracy (see "Technique of Josephson Computer", Parity, Separate Volume No. 1, 1986, pp 26–38).

The prior art provides SQUID devices which mainly utilize a tunnel junction including a very thin insulation film which is sandwiched between members of niobium (Nb) or niobium nitride (NbN). It is always assumed that these SQUID devices operate at boiling point of liquid helium (4.2K). If SQUID devices are formed of a superconductor of high-temperature oxide, they can operate at boiling point of liquid nitrogen, resulting in increased practicality and economical efficiency.

Presently, however, many DC-SQUID's formed of superconducting oxide films are produced by forming steps in any suitable manner before growth (see "Japanese Journal of Applied Physics", Vol. 30, No. 6B, L1121–L1124, January 1991).

On the other hand, it is known in the art that the naturally produced tilt-boundary junction functions as a Josephson junction. It has been reported that the critical current was measured in a twin tilt-boundary junction of yttrium compound ($YBa_2Cu_3O_{7-\delta}$). (See "PHYSICAL REVIEW LETTERS" issued on Jul. 11, 1988, Vol. 61, No. 2, pp 219–222.)

However, a method of controlling the production of Josephson junctions from the tilt-boundary junction is still not known.

It was further difficult to arrange a number of stepped DC-SQUID's in any pattern at desired locations.

SUMMARY OF THE INVENTION

It is therefore an object of the present invention to form SQUID devices at desired locations in any pattern, by utilizing the tilt-boundary junction.

To this end, the present invention provides a process of making a SQUID device utilizing the tilt-boundary junction, the process comprising the steps of forming a film of oxide having a desired pattern on a substrate of magnesia; forming a superconducting oxide film over that portion of said magnesia substrate exposed at said film forming step and also said oxide film to form a tilt-boundary junction in the boundary between the superconducting oxide film portion on said magnesia substrate and the superconducting oxide film portion on said oxide film; and using the formed tilt-boundary junction to form a SQUID pattern.

At the step of forming the thin oxide film into the desired pattern, the magnesia substrate has the non-exposed faces covered by the thin oxide film and the exposed faces at which the thin oxide film is removed. After the thin superconducting oxide film has been formed over both the non-exposed and exposed faces, it will have a deviation in epitaxial direction by an angle between the parts of magnesia substrate and thin oxide film. Thus, any tilt-boundary junction can be artificially formed at the boundary of the pattern. By controlling the configuration of the thin oxide film, therefore, one can provide a Josephson junction having any desired pattern.

The formation of a DC-SQUID pattern on the Josephson junction enables the DC-SQUID to be formed at a desired location.

The tilt-boundary junction functions as a Josephson junction. Thus, the tilt-boundary junction so formed can be utilized to produce a SQUID device on the substrate at a desired location.

The aforementioned SQUID pattern is the DC-SQUID pattern.

The step of forming the DC-SQUID pattern further includes the step of etching the superconducting oxide film to form an opening including the tilt-boundary junction.

The etching step may be FIB sputtering.

The etching may be continued until the magnesia substrate is exposed.

The oxide film may be $Bi_2Sr_2CuO_6$ and the superconducting oxide film may be $Bi_2Sr_2CaCu_2O_8$.

The etching may be FIB utilizing a $Au^+$ beam.

The present invention also provides a SQUID device utilizing the tilt-boundary junction, comprising a substrate of magnesia; a film of oxide formed on part of said magnesia substrate; a superconducting oxide film having a SQUID pattern formed on both the magnesia substrate and oxide film; and a tilt-boundary junction formed at the boundary between the superconducting oxide film portion on the magnesia substrate and the superconducting oxide film portion on the oxide film, said SQUID pattern including said tilt-boundary junction.

The SQUID pattern is a DC-SQUID pattern.

DETAILED DESCRIPTION OF PREFERRED EMBODIMENT

The present invention will now be described by way of example with reference to the drawings.

Figure 1:
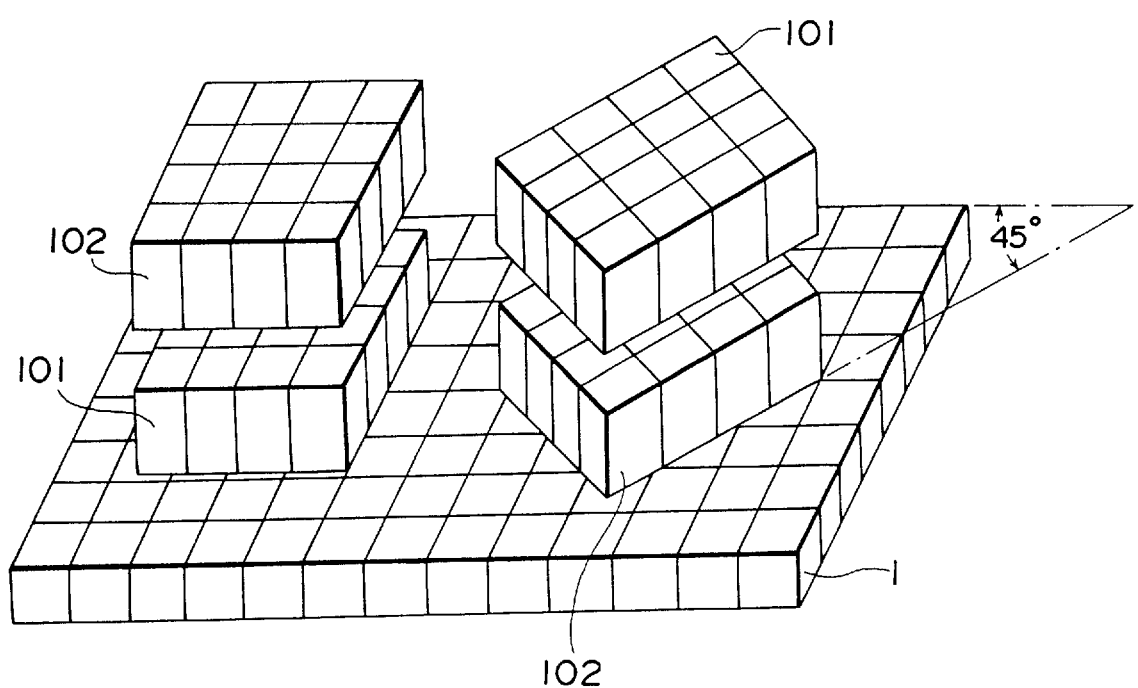
FIG. 1 is a diagrammatic view of thin Bi—Sr—Ca—Cu—O superconducting films layered on a substrate of MgO.

FIG. 1 is a diagrammatic view illustrating that when a thin non-superconducting oxide ($Bi_2Sr_2Cu_1O_6$) film 101 and a thin superconducting oxide ($Bi_2Sr_2Ca_1Cu_2O_8$) film 102 are layered on a substrate of magnesia (MgO) 1 in the reverse order of lamination, the epitaxial direction is deviated by 45 degrees.

More particularly, an epitaxial direction obtained when the thin non-superconducting oxide ($Bi_2Sr_2Cu_1O_6$) film 101 is first formed on the magnesia substrate 1 and the thin superconducting oxide ($Bi_2Sr_2Ca_1Cu_2O_8$) film 102 is then formed on the thin non-superconducting oxide film 101 is deviated 45 degrees from another epitaxial direction obtained when the thin superconducting oxide ($Bi_2Sr_2Ca_1Cu_2O_8$) film 102 is first formed on the magnesia substrate 1 and the thin non-superconducting oxide ($Bi_2Sr_2Cu_1O_6$) film 101 is then formed on the thin superconducting oxide film 102 in the reverse order, as viewed in the horizontal plane of the magnesia substrate 1. It is believed that such a deviation results from any mismatching in the crystal lattice due to a deviation in crystal size between MgO—Bi—Sr—Cu—O and MgO—Bi—Sr—Ca—Cu—O.

Figure 2:
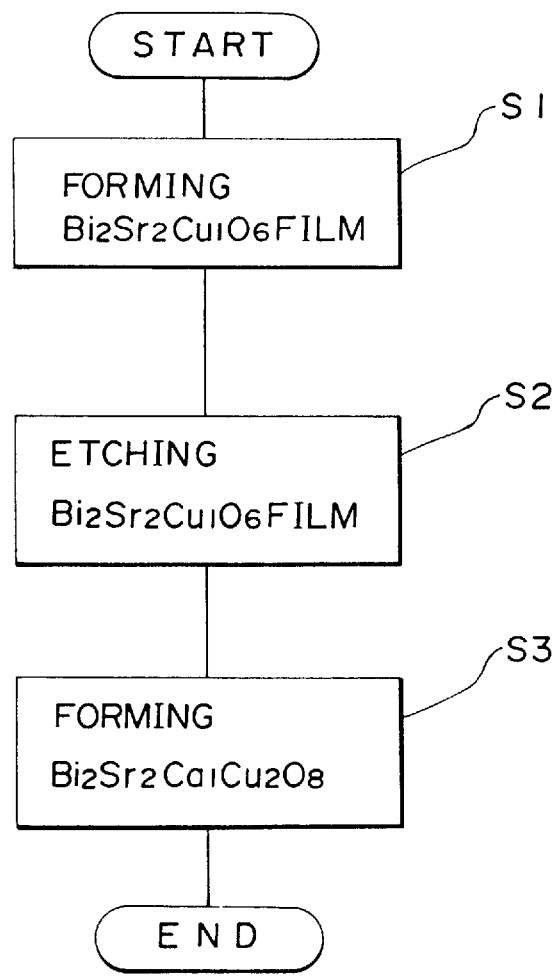
FIG. 2 is a flowchart illustrating a procedure of making a Josephson junction.

In accordance with the present invention, thus, a tilt-boundary junction is formed by the use of such a treatment as shown in FIG. 2. First, the thin non-superconducting oxide ($Bi_2Sr_2Cu_1O_6$) film 101 is formed on the magnesia substrate 1 (S1). Predetermined parts of the formed film 101 are then removed by etching to expose parts of the magnesia substrate 1 (S2). Finally, the thin superconducting oxide ($Bi_2Sr_2Ca_1Cu_2O_8$) film 102 is formed over the entire surface of the substrate and non-superconducting oxide film 101 (S3). Each part of the thin film 102 on the magnesia substrate 1 will have an epitaxial orientation deviated 45 degrees along a and b axes on the crystal surface from that of the corresponding part of the thin film 102 on the thin film 101 to form a tilt-boundary junction. If parts of the thin film 101 to be removed are controlled, thus, it is possible to form the tilt-boundary junction having any desired pattern.

Figure 3:
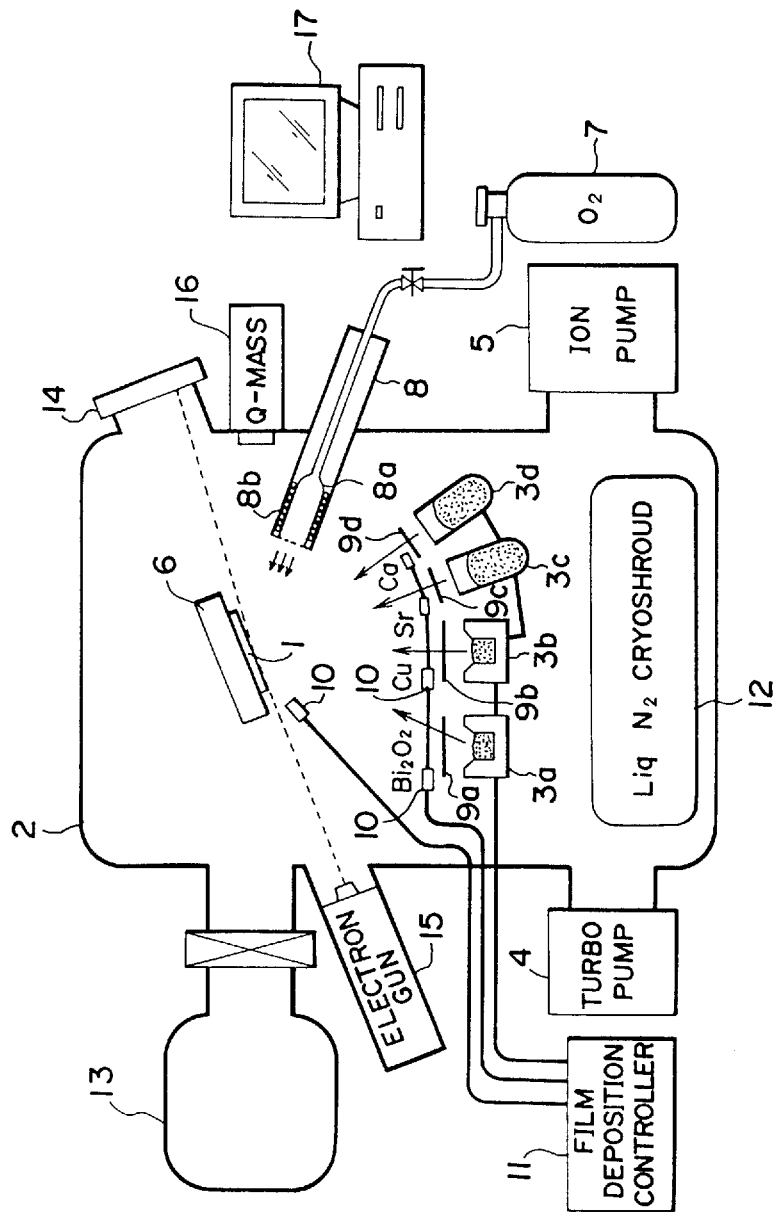
FIG. 3 is a schematic diagram of a film forming apparatus which uses a molecular beam epitaxy system.

Referring to FIG. 3, there is shown a film forming apparatus using a molecular beam epitaxy system. The film forming apparatus comprises growth chamber 2, which is maintained in a ultra-high vacuum, and four evaporation sources 3a–3d which are disposed within the growth chamber 2. Each of these sources 3a–3d independently emits bismuth oxide ($Bi_2O_3$), metal strontium (Sr), metal calcium (Ca) or copper (Cu) respectively in the form of molecules or atoms. The matter emitted from each source irradiates onto the magnesia substrate 1. Two of these sources of evaporation 3a and 3b are electron beam sources while the remaining sources 3c and 3d are resistance heating crucibles. The growth chamber 2 is connected to a turbo pump 4 and an ion pump 5. These pumps 4 and 5 are adapted to evacuate the growth chamber 2 to maintain the interior thereof at a given state.

A substrate holder 6 is disposed in the growth chamber 2 at the upper level and adapted to hold the magnesia substrate 1 at a fixed position. The chamber 2 further includes a oxygen radical beam source 8 which is adapted to receive gaseous oxygen from a supply of oxygen 7 and to convert the gaseous oxygen into oxygen radicals which are in turn blown onto the magnesia substrate 1. The radical beam source 8 includes a quartz tube 8a through which the gaseous oxygen passes and a coil 8b wound about the quartz tube 8a. When the coil 8b is energized by high-frequency electric current, the gaseous oxygen in the quartz tube 8a will be high-frequency excited to separate the oxygen into oxygen radicals. The front face of the quartz tube 8a includes a plurality of openings formed therein through which the oxygen radicals are drawn out of the quartz tube 8a under a differential pressure between the interior of the quartz tube 8a and the growth chamber 2. In such a manner, the oxygen atoms will be efficiently blown onto the magnesia substrate 1.

Above each of the sources 3a–3d is disposed a shutter 9a, 9b, 9c or 9d which is adapted to control the irradiation of the emitted matter from the corresponding source 3a, 3b, 3c or 3d onto the substrate 1. Sensors 10a–10e are located near the shutters 9 and substrate 1, respectively. The outputs of these sensors 10a–10e are supplied to a film deposition controller 11 which is adapted to control the evaporation from at least the sources 3a and 3b, depending on the results of detection at the sensors 10a–10e. The substrate 1 is heated by a heater (not shown) which is located within the holder 6. The growth chamber 2 further includes a liquid nitrogen shroud 12 to prevent the generation of gases from peripheral areas of the sources 3a–3d.

The growth chamber 2 is connected to a loading chamber 13 which is used to load and unload the substrate 1 on condition that the growth chamber 2 is isolated from atmosphere. A RHEED screen 14 is provided for analyzing the crystal structures of thin films formed on the substrate 1, based on a diffraction state of an electron beam from an electron gun 15 which reaches the RHEED screen 14. The growth chamber 2 is further connected to a quadrupole mass analyzer 16 for analyzing the composition of the gas within the chamber 2. A computer 17 is provided for controlling the entire operation of the film forming apparatus.

When it is desired to form the thin Bi—Sr—Cu—O film 101 on the substrate 1, the materials $Bi_2O_3$, Sr, Cu and oxygen radicals O* are irradiated onto the substrate 1 after being heated to a given temperature. The materials $Bi_2O_3$, Sr and Cu are sequentially evaporated from the respective sources by sequentially opening the shutters 9a–9d. The order of Bi—Sr—Cu—Sr—Bi forms one cycle of deposition which will be repeated sequentially. Thus, the thin film 101 will be formed sequentially in such an order as shown by Bi—Sr—Cu—Sr, Bi—Sr—Cu—Sr—Bi, . . . and Bi—Sr—Cu—Sr—Bi. At the same time, oxygen radicals are supplied to the growth chamber 2 during each deposition cycle. The rate of evaporation from each of the sources is: 0.125 nm/sec. for $Bi_2O_3$; 0.22 nm/sec. for Sr; and 0.04 nm/sec. for Cu. The rate of supply for O* is equal to $1\times10^{16}$ species/sec.$cm^2$. The rate of evaporation is determined by measuring the amount of deposition on each of the respective sensors 10.

The time for which each source of evaporation is released once by opening the corresponding shutter during one cycle is as follows: 3.20 seconds for $Bi_2O_3$; 4.02 seconds for Sr; and 2.90 seconds for Cu. The cycle was repeated 2–100 times to obtain a thin film 101 having a given thickness.

When it was set that the temperature of the substrate is in the range between 650° C. and 750° C. and that the speed of film growth is in the range between 0.02 nm/sec. and 0.1 nm/sec., a thin Bi—Sr—Cu—O film was obtained with its thickness in the range between 2.4 nm and 130 nm. In the embodiment, the cycle was repeated 40 times to obtain a thin film 101 having a thickness of 50 nm. It is further desirable that this thin non-superconducting oxide ($Bi_2Sr_2Cu_1O_6$) film is formed so as to be as thin as possible to prevent any step from being created on the surface of the final product.

Although this embodiment has been described as to the simultaneous irradiation of the materials $Bi_2O_3$, Sr and Cu and oxygen radicals O*, the oxygen radicals O* may be irradiated onto the substrate after each layer of Bi—Sr—Cu—Sr—Bi has been deposited on the substrate.

The thin non-superconducting oxide film 101 is then etched to form a desired pattern thereon. In such a step, the magnesia substrate 1 will have exposed parts created by partially removing the thin non-superconducting oxide film 101.

Figure 4:
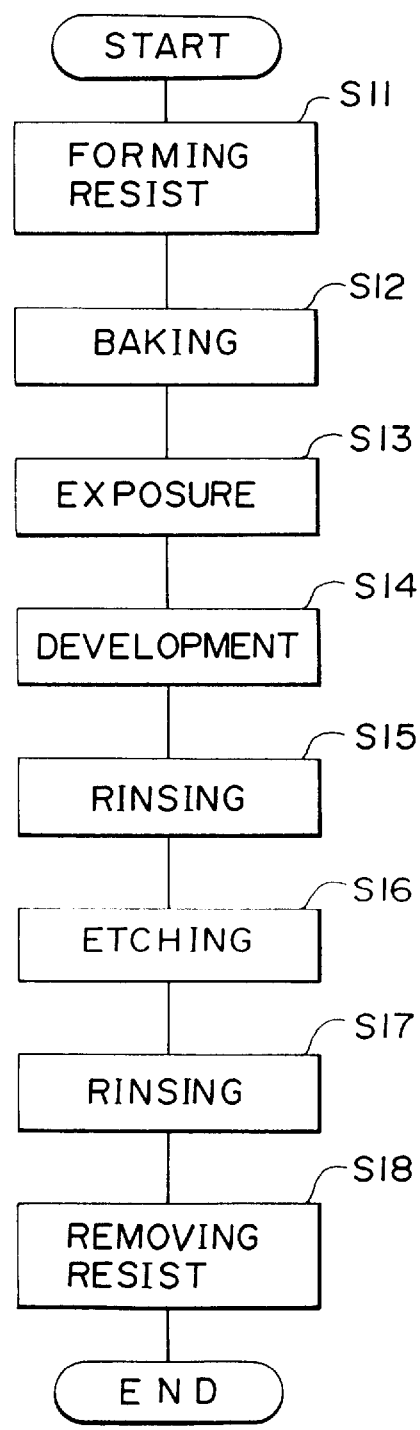
FIG. 4 is a flowchart illustrating the etching step.

The etching step for the thin non-superconducting oxide ($Bi_2Sr_2Cu_1O_6$) film 101 will be described with reference to FIG. 4. First of all, a PMMA electron beam resist layer (trade name: OEBR-1000 manufactured by TOKYO OHKA KOGYO) having a film thickness equal to about 0.6 $\mu$m is applied over the thin non-superconducting oxide film 101 (S11). This application of resist may be carried out in any suitable manner such as spin coating or the like. It is then baked at 150° C. for about 20 minutes (S12). The formed resist layer is then subjected to an exposure step by the use of a focused ion beam (FIB) system (S13). The exposure is done under the following conditions: 200 keV, $Be^{++}$ and $1\times10^{13}$ ions/$cm^2$. The exposed resist is developed to partially remove it along the desired pattern by the use of a mixture of methylcellosolve with isopropyl alcohol (S14). The development step is done with the mixture of methylcellosolve:isopropyl alcohol=72.5:27.5 at 22° C. for about 4 minutes. However, the conditions of development may not be limited severely to such parameters, but may be changed through a very wide range. After the development, the film is rinsed with isopropylalcohol at room temperature for several tens of seconds (S15).

A solution of bromine ($Br_2$) with ethanol (0.01–0.1% by volume) is used to etch the thin non-superconducting oxide film 101 at its parts in which the resist is removed (S16). The etching step is carried out at room temperature for about 10–20 seconds. After the etching step, the film is rinsed with ethanol (S17).

Finally, the film is rinsed with acetone for several minutes to remove the remaining resist (S18). After being dried, the magnesia substrate 1 will have the thin non-superconducting oxide film 101 and the exposed parts of the magnesia substrate 1. Since any pattern can be provided by exposure, it is possible to obtain a Josephson junction having any desired pattern.

Although the above embodiment has been described as to the use of PMMA as a resist, the present invention is not limited to such a resist and may be applied to any other suitable resist material. Since it must be non-soluble on etching, however, it is required to use a resist which is non-soluble with ethanol. Further, the exposure may be performed by electron beam or X-ray beam rather than FIB.

The aforementioned etching is carried out without exposure to water. If water is used on etching, the thin non-superconducting oxide film 101 will be severly damaged, breaking the crystal system thereof. In this case, a thin superconducting oxide film 102 to be layered on the thin non-superconducting oxide film 101 and magnesia substrate 1 will not be formed with a satisfactory crystal structure.

The etching step may be replaced by another step at which the magnesia substrate 1 is covered with a metallic mask (not shown) having a desired pattern and the thin non-superconducting oxide film 101 is then formed on the magnesia substrate 1 in such a manner as described hereinbefore.

The materials $Bi_2O_3$, Sr, Ca and Cu and oxygen radicals O* are then irradiated onto the heated substrate 1 to form a thin Bi—Sr—Ca—Cu—O superconducting oxide film 102 in the same manner as described hereinbefore. The materials $Bi_2O_3$, Sr, Ca and Cu are deposited on the substrate 1 in the order of Bi—Sr—Cu—Ca—Cu—Sr—Bi during one cycle. Such a cycle is repeated to deposit these materials on the substrate 1. The rates of evaporation and supply for each substance is substantially as follows: 0.125 nm/sec. for $Bi_2O_3$; 0.22 nm/sec. for Sr; 0.04 nm/sec. for Cu; 0.22 nm/sec. for Ca; and $1\times10^{16}$ species/sec.$cm^2$ for the oxygen radicals.

Each evaporation source is released by opening the corresponding shutter for the following time period: 3.20 seconds for $Bi_2O_3$; 4.02 seconds for Sr; 2.90 seconds for Cu; and 3.85 seconds for Ca. This cycle is repeated 10–100 times.

When it is set that the temperature of the heated substrate 1 is in the range between 650° C. and 750° C. and that the speed of film growth is in the range between 0.02 nm/sec. and 0.1 nm/sec., a thin Bi—Sr—Ca—Cu—O superconducting oxide film 102 having a thickness in the range between 15 nm and 150 nm was obtained. In the embodiment, the cycle was repeated 65 times to obtain a thin film 102 having a thickness of 100 nm.

Although this embodiment has been described as to the simultaneous irradiation of the materials $Bi_2O_3$, Sr, Ca, Cu and O*, only the oxygen radicals O* may be irradiated onto the substrate 1 after each layer of Bi—Sr—Cu—Ca—Cu—Sr—Bi has been deposited on the substrate 1.

Figure 5:
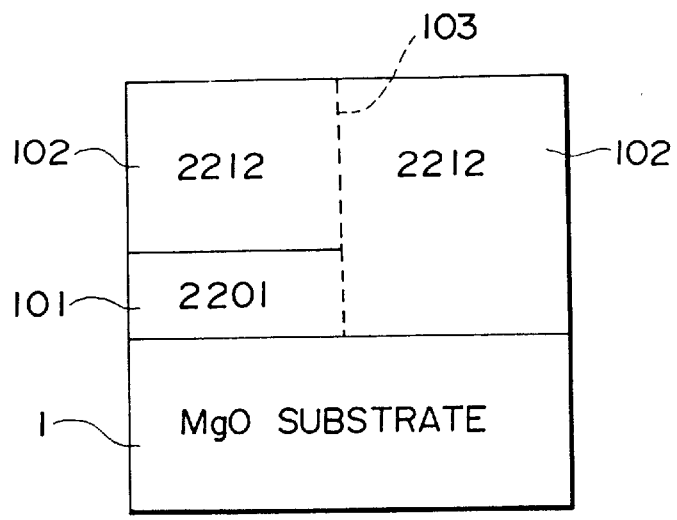
FIG. 5 is a diagrammatic cross-section of a layered structure comprising a thin Bi—Sr—Cu—O film and a thin Bi—Sr—Ca—Cu—O superconducting film on the MgO substrate.

FIG. 5 is a diagrammatic view illustrating that after the thin non-superconducting oxide ($Bi_2Sr_2Cu_1O_6$) film shown by 2201 has been formed on the magnesia substrate 1, the surface of the magnesia substrate 1 is partially exposed by forming the desired pattern thereon and that a thin superconducting oxide ($Bi_2Sr_2Ca_1Cu_2O_8$) film 102 as shown by 2212 in FIG. 5 is formed over the exposed parts of the magnesia substrate 1 and the thin non-superconducting oxide film 101. In FIG. 5, the thin superconducting oxide film 102 is shown to have a flat surface. Actually, a step will be created on the surface of the thin superconducting oxide film 102 since it is uniformly deposited over the exposed parts of the magnesia substrate 1 and the thin non-superconducting oxide film 101.

Figure 6:
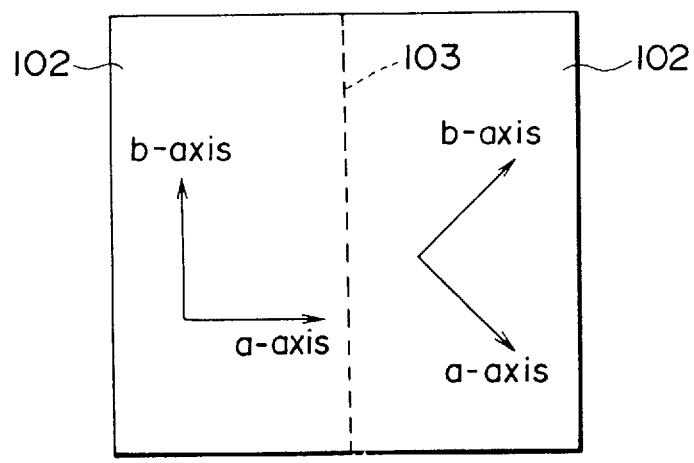
FIG. 6 is a diagrammatical plan view illustrating a deviation in epitaxial direction in the thin Bi—Sr—Ca—Cu—O superconducting film.

FIG. 6 is a plan view showing such a structure. As will be apparent from this figure, the epitaxial orientation (a- and b-axes) of the thin superconducting oxide film 102 on the magnesia substrate 1 is deviated 45 degrees from that of the thin superconducting oxide film 102 on the thin non-superconducting oxide film 101. FIG. 6 also shows a tilt-boundary junction 103 formed between the thin superconducting oxide film 102 and the thin non-superconducting oxide film 101.

Figure 7:
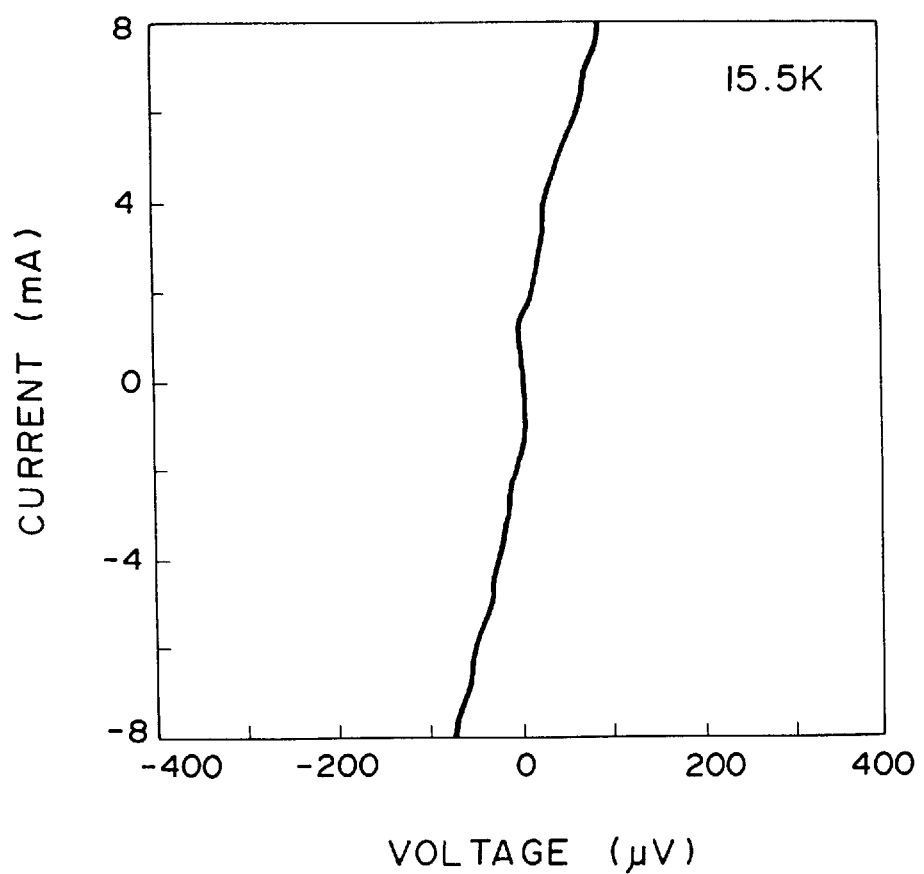
FIG. 7 is a graph illustrating current-voltage characteristics in the tilt-boundary junction at 15.5K.
Figure 8:
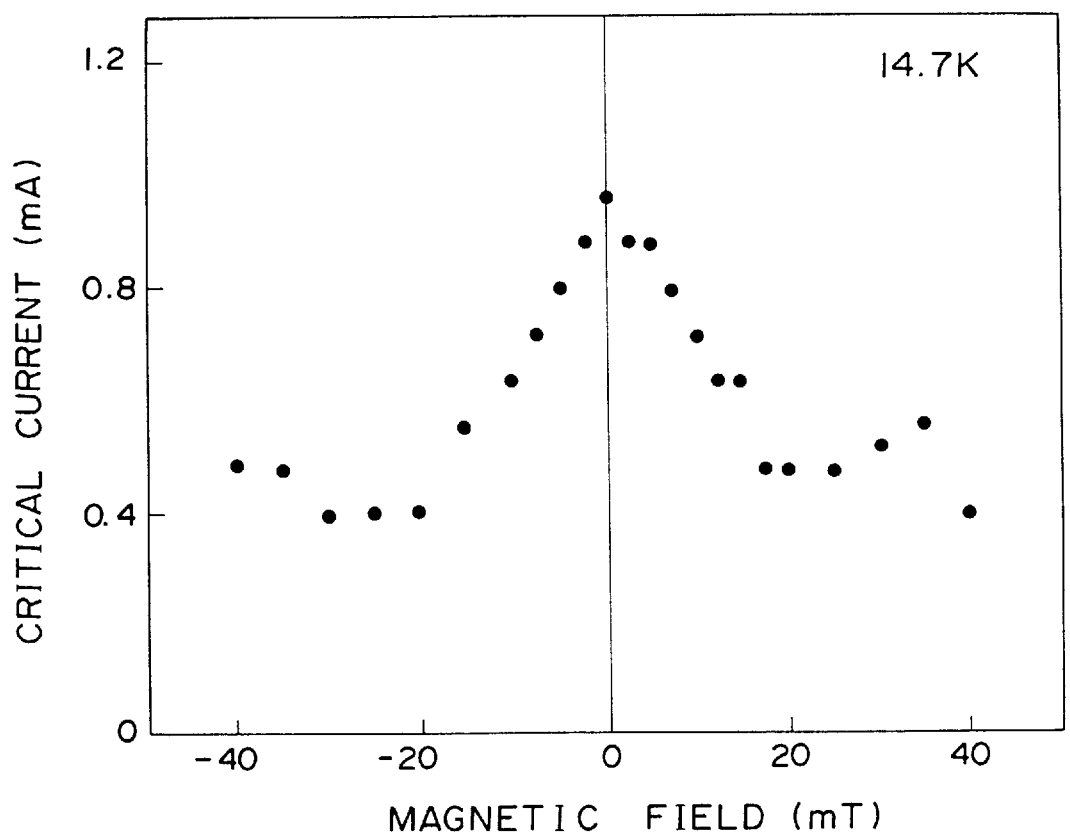
FIG. 8 is a graph illustrating the dependency of critical current on the magnetic field in the tilt-boundary junction at 14.7K.

FIGS. 7 and 8 illustrate that the tilt-boundary junction (having its junction size of 1 mm×0.1 $\mu$m) functions as a Josephson junction. FIG. 7 shows the current-voltage characteristics in the tilt-boundary junction at 15.5K. It will be apparent from FIG. 7 that the current changes to 1.2 mA at zero voltage. This shows that the superconducting current is 1.2 mA. FIG. 8 shows the dependency of critical current on magnetic field at 14.7K in the tilt-boundary junction. It will be apparent from FIG. 8 that the critical current periodically changes depending on changes of the magnetic field. Such a phenomenon is called Fraunhofer's pattern. This indicates that the produced junction is a Josephson junction. If the Fraunhofer's pattern is in an ideal form, the critical current at a trough in the pattern must be equal to zero. It is, however, well-known that if the Josephson junction has its area of some magnitude, the critical current at the trough will not be equal to zero. It is therefore understood from FIG. 8 that the formed junction functions as a Josephson junction.

Figure 9:
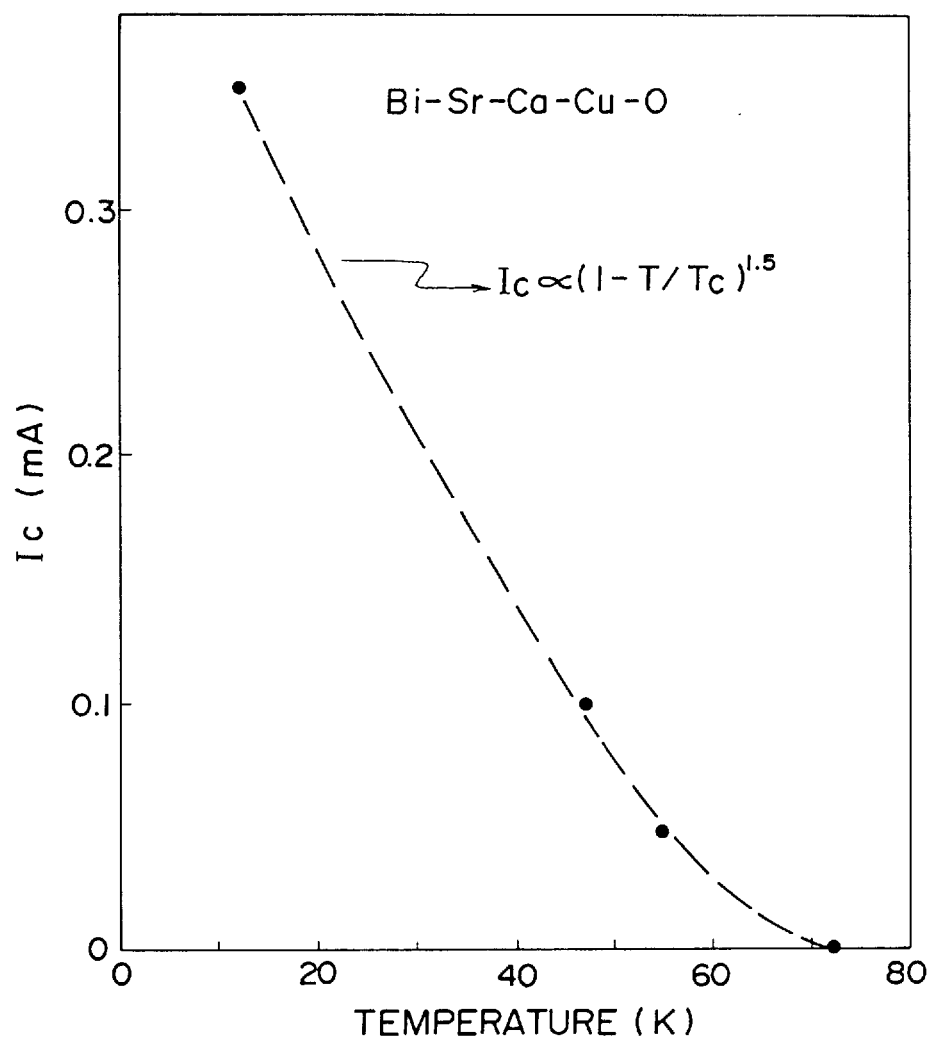
FIG. 9 is a graph illustrating changes of the critical current relative to temperatures.

FIG. 9 also illustrates that this tilt-boundary junction functions as a Josephson junction and that the critical current in the tilt-boundary junction changes depending on temperature. Apparently, there is produced a superconducting current at a level equal to or less than 70K. In FIG. 9, the critical current is denoted by Ic; the measured temperature T; and the critical temperature Tc.

Although this embodiment has been described as to the thin superconducting oxide film of $Bi_2Sr_2Ca_1Cu_2O_8$, it may be replaced by any other appropriate thin superconducting oxide film or any one of the other superconducting oxides and/or the other substrate materials.

Figure 10:
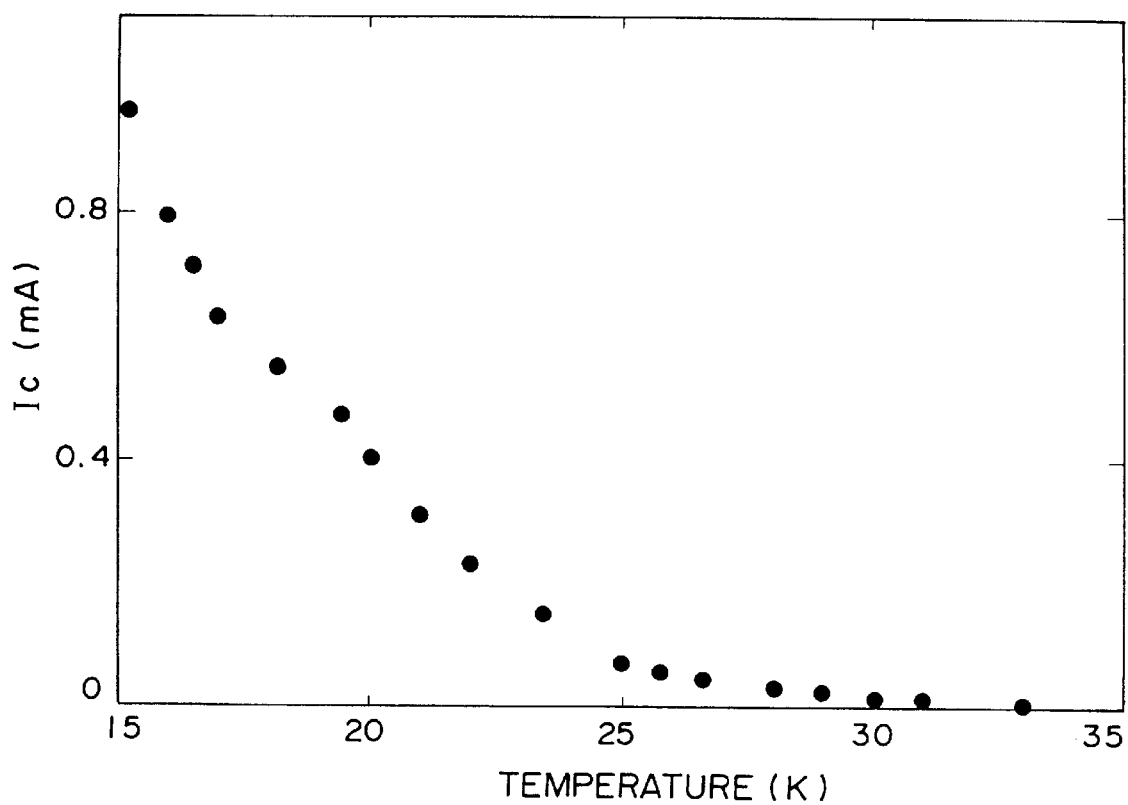
FIG. 10 is a graph illustrating changes of the critical current relative to temperatures.

Furthermore, FIG. 10 shows that the other Josephson junction utilizing a tilt-boundary junction prepared under substantially the same conditions as described hereinbefore has its critical current changing depending on temperature. In this example, the superconducting current flows therein at a level equal to or less than 35K. Similarly, the superconducting current near 15.5K is equal to about 1.2 mA.

In order to cause the Josephson junctions thus prepared to actually operate, they include electrodes mounted on two parts of the thin superconducting oxide film 102 which are connected to each other through the tilt-boundary junction.

There will be described a procedure of forming a DC-SQUID pattern at the boundary of the prepared Josephson junction through $Au^+$ FIB sputtering and the DC-SQUID characteristics of specimens.

The SQUID's are highly-sensitive magnetism detectors which can be classified into DC-SQUID type and RF SQUID type. The prepared specimen is a DC-SQUID and characterized by having a superconducting ring including two Josephson junctions. When a current flows through the specimen in the magnetic field, the difference of phase between two junctions is changed to provide a changed output voltage which in turn is measured to detect a minute magnetic field. With changes in the magnetic field, the output voltage is periodically variable.

Figure 11:
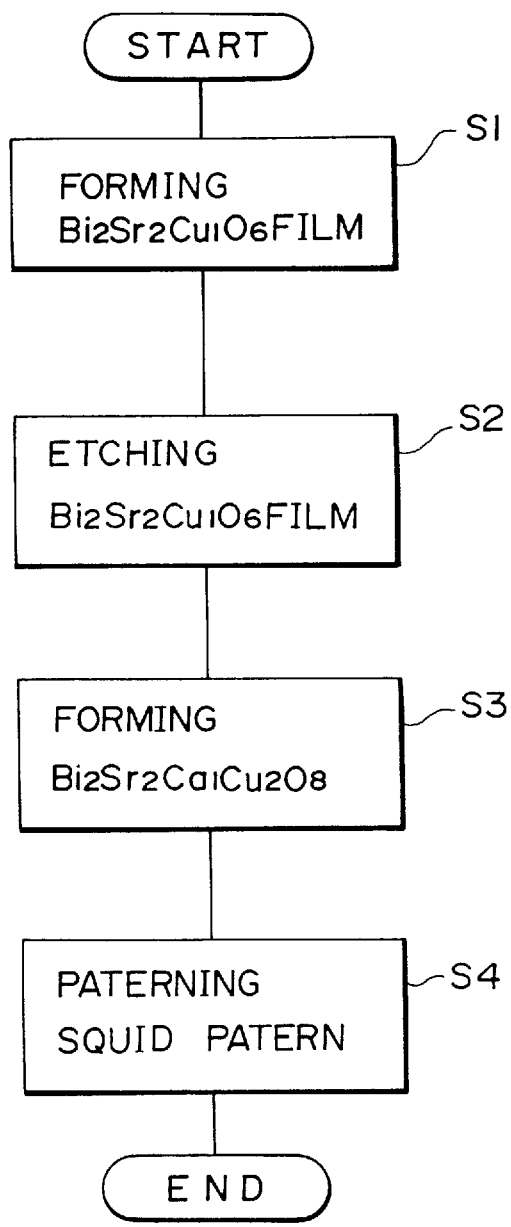
FIG. 11 is a flowchart illustrating a procedure of making a DC-SQUID device.

FIG. 11 shows a procedure of forming a DC-SQUID pattern. After being prepared through steps S1–S3, a superconducting oxide film having a tilt-boundary junction is then subjected to a patterning step (S4). The DC-SQUID pattern is formed on the magnesia substrate through the $Au^+$ FIB sputtering process.

The sputtering process used an $Au^+$ FIB having an energy equal to 40 keV. Previous measurements of the superconducting oxide film and oxide film which were specimens showed that the speed of etching was about one $nm^3$/ion, without any significant difference of etching speed therebetween. To operate on a thin film having its thickness equal to about 150 nm, it was subjected to ion irradiation of $1.5 \times 10^{17}$ ions/$cm^2$.

Although this embodiment has been described referring to the use of $Au^+$ FIB having the energy of 40 keV, any other suitable FIB such as Ga FIB, Bi FIB or the like may be used. The energy may be ranged between several keV and several hundreds keV.

Furthermore, the FIB sputter etching process may be replaced by any other suitable process. For example, there may be used a process of breaking the crystal structure of a thin film through ion-implantation. If a thin film is irradiated by Si FIB having its energy of several hundreds keV at a rate of $10^{14}$–$10^{15}$ ions/$cm^2$, the superconductive property of the irradiated portion is broken. Therefore, if a specific part such as a hole 14 is irradiated by Si FIB, it can be worked into a desired configuration. Since such a process does not etch the thin film, however, it is required to select a depth of ion penetration into the film that is larger than the thickness of the film itself. Consequently, the ions used herein are preferably lighter than those of the aforementioned sputter etching process, with an increased energy equal to or higher than about 100 keV.

Alternatively, wet etching may be carried out using bromine or acid after a resist such as PMMA has been applied and patterned to the film as in the step S2. Furthermore the following manner can be used in step S2. After the resist has similarly been patterned, the crystal structure of the film may be broken through the sputter etching of Ar ion beam or ion implantation.

Figure 12:
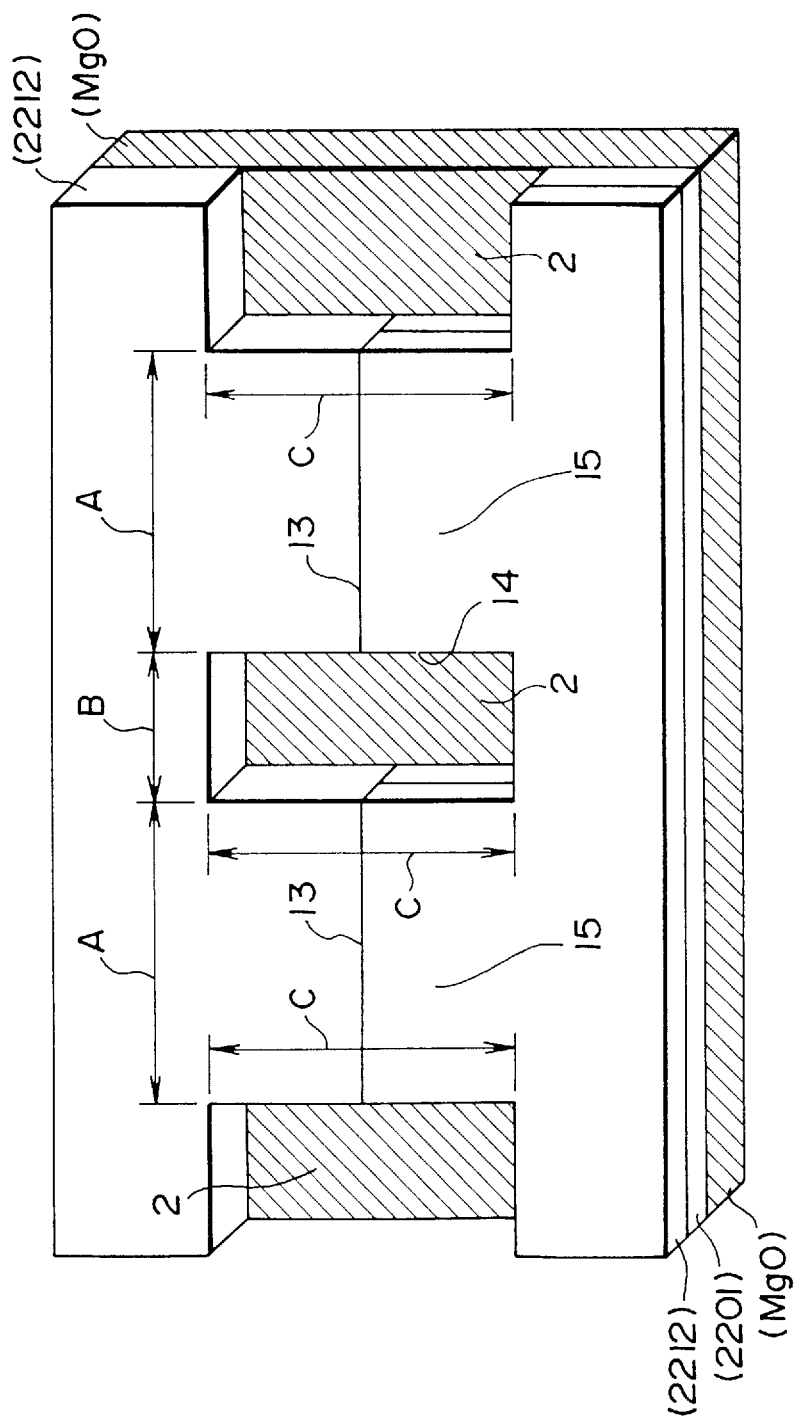
FIG. 12 is a diagrammatically plan view of a DC-SQUID pattern.

FIG. 12 is a plan view of a DC-SQUID pattern which is prepared by the $Au^+$ FIB sputtering. This DC-SQUID pattern has a central hole 14 of 2 $\mu$m (B)×10 $\mu$m (C) and bridges 15 of a width (A) equal to 20 $\mu$m hatching shows parts of the MgO substrate 2 which are exposed through the FIB sputtering.

Figure 13:
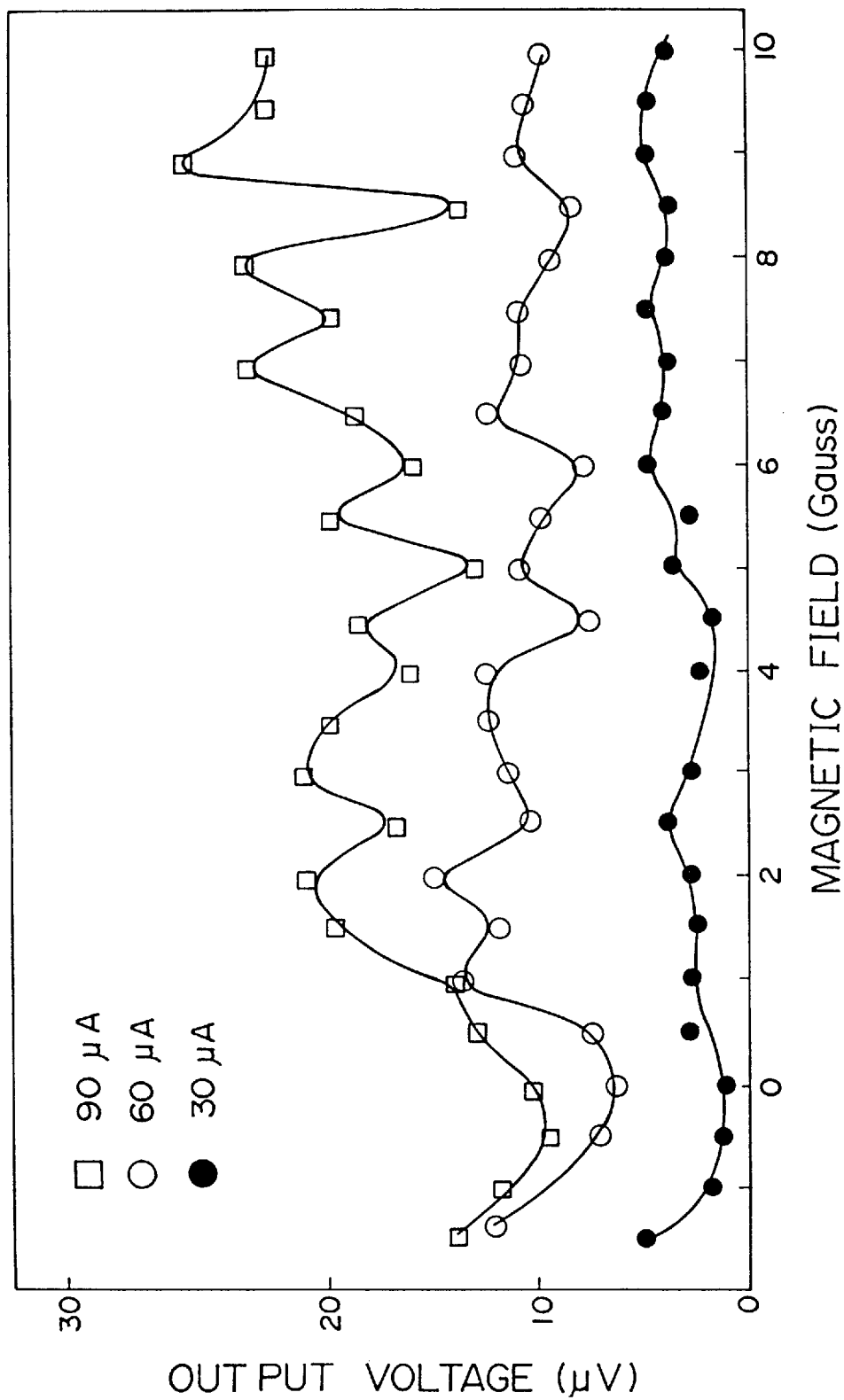
FIG. 13 is a graph showing the dependency of the output voltage of the DC-SQUID at 16K on the magnetic field.

The prepared pattern was formed with electrodes through gold deposition. When the pattern was subjected to the application of a magnetic field (0 gauss–10 gauss) perpendicular to the plane thereof and an electric current (30 $\mu$A–90 $\mu$A), the dependency of the output voltage on the magnetic field was measured. At 16K, the result is shown in FIG. 13. It is found that the output voltage varies through a cycle of about one gauss, depending on changes of the magnetic field. Such a periodicity shows that the prepared pattern functions as a DC-SQUID, as described. The periodicity of change can be determined by the following formula:

$$B_0 = \Phi_0/S [\text{gauss}]$$

where $\Phi_0$ is a flux quantum represented by a constant, $\phi_0 = 2.07 \times 10^{-11}$ [gauss $m^2$] and S is the area of the hole in the SQUID and is represented by $$S = 2 \times 10 = 20 \ [\mu m^2] = 2 \times 10^{-11} \ [m^2].$$

The determined period of change $B_0$ is substantially equal to one gauss and coincides with the above result.

In accordance with the process of the present invention, a number of DC-SQUID's can be formed at desired locations in any pattern. Consequently, the DC-SQUID utilizing the high-temperature superconductor of oxide film can very easily be produced with remarkably improved utility and economy.

We claim:

1. A process of making a SQUID device utilizing the tilt-boundary junction, said process comprising the steps of:

forming a non-superconducting oxide film of Bi—Sr—Cu—O compound having a desired pattern by sequentially depositing at least Bi, Sr and Cu on a substrate of magnesia;

forming a superconducting oxide film of Bi—Sr—Ca—Cu—O compound by sequentially depositing at least Bi, Sr, Ca and Cu over that portion of said magnesia substrate exposed at said film forming step and also over said non-superconducting oxide film to form a tilt-boundary junction in the boundary between the superconducting oxide film portion on said magnesia substrate and the superconducting oxide film portion on said non-superconducting oxide film; and using the formed tilt-boundary junction to form a SQUID pattern.

2. A process as defined in claim 1 wherein said SQUID pattern is a DC-SQUID pattern.

3. A process as defined in claim 2 wherein said step of forming said DC-SQUID pattern includes the step of etching said superconducting oxide film to form an opening including the tilt-boundary junction.

4. A process as defined in claim 3 wherein said etching step is performed by FIB sputtering.

5. A process as defined in claim 4 wherein said etching step is continued until the magnesia substrate is exposed.

6. A process as defined in claim 3 wherein said non-superconducting oxide film is $Bi_2Si_2CuO_6$ and said superconducting oxide film is $Bi_2Sr_2CaCu_2O_8$.

7. A process as defined in claim 6 wherein said etching is FIB utilizing a $Au^+$ beam.

8. A method as defined in claim 1 wherein said step of forming a non-superconducting oxide film is carried out by depositing Bi, Sr, Cu, Sr and Bi, in the order recited, on the substrate.

9. A method as defined in claim 1 wherein said step of forming a superconducting oxide film is carried out by depositing Bi, Sr, Cu, Ca, Cu, Sr and Bi, in the order recited, on the substrate.

* * * * *